United States Patent
Lee et al.

(10) Patent No.: US 7,961,523 B2
(45) Date of Patent: Jun. 14, 2011

(54) NONVOLATILE MEMORY DEVICE AND PROGRAMMING METHOD

(75) Inventors: Jong-Hoon Lee, Suwon-si (KR); Bo-Geun Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 215 days.

(21) Appl. No.: 12/430,971

(22) Filed: Apr. 28, 2009

(65) Prior Publication Data

US 2009/0273983 A1 Nov. 5, 2009

(30) Foreign Application Priority Data

Apr. 30, 2008 (KR) ................ 10-2008-0040720

(51) Int. Cl.
*G11C 11/34* (2006.01)
*G11C 16/04* (2006.01)
*G11C 16/06* (2006.01)
*G11C 7/00* (2006.01)
(52) U.S. Cl. ......... 365/185.25; 365/185.11; 365/185.17; 365/185.28; 365/191; 365/196; 365/203

(58) Field of Classification Search ............. 365/185.11, 365/185.17, 185.25, 185.28, 191, 196, 203
See application file for complete search history.

(56) References Cited

U.S. PATENT DOCUMENTS

| | | | | |
|---|---|---|---|---|
| 5,923,586 A | * | 7/1999 | Choi | 365/185.09 |
| 6,044,017 A | * | 3/2000 | Lee et al. | 365/185.18 |
| 2002/0110040 A1 | * | 8/2002 | Kwon | 365/230.06 |
| 2002/0191443 A1 | * | 12/2002 | Lee et al. | 365/185.18 |
| 2006/0044872 A1 | | 3/2006 | Nazarian | |
| 2009/0231928 A1 | * | 9/2009 | Kim | 365/185.22 |

FOREIGN PATENT DOCUMENTS

| | | |
|---|---|---|
| KR | 1020060031024 A | 4/2006 |
| KR | 1020060104834 A | 10/2006 |
| KR | 1020070086721 A | 8/2007 |

* cited by examiner

*Primary Examiner* — Ly D Pham
(74) *Attorney, Agent, or Firm* — Volentine & Whitt, PLLC

(57) ABSTRACT

Disclosed is a programming method for a nonvolatile memory device. The method includes; charging word-line signal lines to a pass voltage during a pass voltage charge operation, simultaneously executing an initial precharge operation for strings including program-inhibited cells during the pass voltage charge operation, and applying the pass voltage to word lines from the word-line signal lines in response to a block-selection enabling signal.

20 Claims, 6 Drawing Sheets

NONVOLATILE MEMORY DEVICE AND PROGRAMMING METHOD

CROSS-REFERENCE TO RELATED APPLICATIONS

This U.S. non-provisional patent application claims priority under 35 U.S.C. §119 to Korean Patent Application No. 10-2008-0040720 filed on Apr. 30, 2008, the subject mater of which is hereby incorporated by reference.

BACKGROUND

The present invention relates to nonvolatile memory devices and programming methods.

Nonvolatile memory devices retain stored data in the absence of applied power. Among the broader class of nonvolatile memory devices, flash memory has been widely adopted for use within contemporary electronics such as computers, memory cards, portable music systems, cell phones, etc.

Flash memory may be divided into two general classes: NOR type and NAND type in accordance with its constituent interconnection logic between memory cells and bit lines. NOR flash memory provides relatively high data access speed, but is less susceptible to integration and consumes more power during operation. In contrast, NAND flash memory is relatively slower, but enjoys much higher integration density and reduced current consumption.

In conventional NAND flash memory, a single word line is shared by a plurality of so-called "program cells" (i.e., memory cells to be programmed) and program-inhibited cells (i.e., memory cells inhibited for programming). Program operations for NAND flash memory typically employed certain self-boosting schemes to prevent the program-inhibited cells from being inadvertently programmed during the programming operation.

SUMMARY OF THE INVENTION

Embodiments of the invention are directed to a nonvolatile memory device and programming method capable of reducing a pass voltage activation time and charge pump size while enhancing self-boosting efficiency.

In one embodiment, the invention provides a programming method for a nonvolatile memory device, comprising; charging word-line signal lines to a pass voltage during a pass voltage charge operation, simultaneously executing an initial precharge operation for strings including program-inhibited cells during the pass voltage charge operation, and applying the pass voltage to word lines from the word-line signal lines in response to a block-selection enabling signal.

In another embodiment, the invention provides a nonvolatile memory device comprising; a block string selection transistor electrically connecting a string selection signal line to a string selection line in response to a block-enable signal, block selection transistors electrically connecting word-line signal lines to word lines respectively in response to the block-enable signal, and a string selection line driver applying a string selection voltage to the string selection line to execute an initial precharge operation for strings including program-inhibited cells while simultaneously charging the word-line signal lines to a pass voltage while the block-enable signal is inactive during a programming operation.

BRIEF DESCRIPTION OF THE FIGURES

Non-limiting and non-exhaustive embodiments of the present invention will be described with reference to the following figures, wherein like reference numerals and indicators refer to like or similar components and signals. In the figures.

DESCRIPTION OF EMBODIMENTS

Certain embodiments of the invention will now be described in some additional detail with reference to the accompanying drawings. The present invention may, however, be embodied in many different forms and should not be construed as being limited to only the illustrated embodiments. Rather, the embodiments are presented as teaching examples.

A nonvolatile memory device according to an embodiment of the invention executes an initial precharge operation while charging string selection lines with a pass voltage during a bit-line setup period within a programming operation. Here, the initial precharge operation is an operation charging strings of memory cells including certain program-inhibited cells. These strings of memory cells are charged to a predetermined voltage before starting the programming operation. Certain nonvolatile memory devices according embodiments of the invention execute the initial precharge operation during (or as part of) a constituent programming operation. This incorporation enhances self-boosting efficiency as well as advances an activation time for the pass voltage, thereby allowing reduction in the size of a charge pump operative during the self-boosting process.

Figure 1:
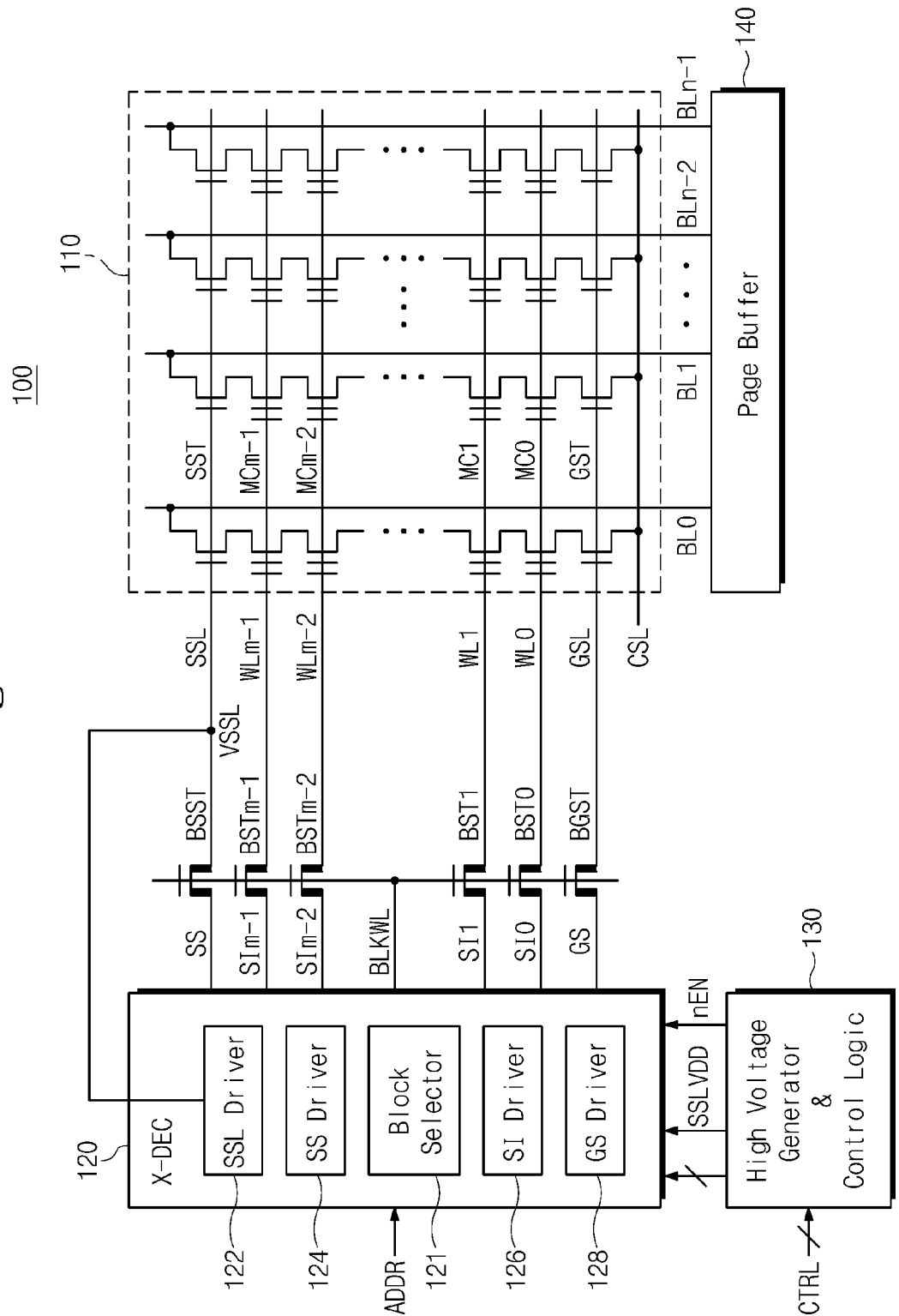
FIG. 1 is a circuit diagram of a nonvolatile memory device according to an embodiment of the invention.

FIG. 1 is a circuit diagram (in relevant portion) of a nonvolatile memory device 100 according to an embodiment of the invention. Referring to FIG. 1, nonvolatile memory device 100 generally comprises a memory cell array 110, a row decoder (X-DEC) 120, a high voltage generator & control logic circuit 130, and a page buffer 140. Row decoder 120 includes a string selection line (SSL) driver 122 providing a string selection voltage VSSL which turns ON/OFF a string selection transistor SST. String selection voltage VSSL is applied via a string selection line SSL while charging word-line (WL) signal lines SI0~SIm-1 to a defined pass voltage. In the illustrated embodiment, SSL driver 122 is directly connected to the SSL.

Nonvolatile memory device 100 shown in FIG. 1 is a NAND type flash memory. However, the invention may not be restrictive in scope to only NAND type flash memory, but may be extended to other types of nonvolatile memories. That is, other embodiments of the invention are applicable to various types of nonvolatile memories, including (e.g.,) NOR flash memory, magnetic ransom access memory (MRAM), phase-change RAM (PRAM), or ferroelectric RAM (FRAM).

Memory cell array 110 is configured in relation to a plurality of bit lines BL0~BLn-1, a plurality of word lines WL0~WLm-1, and a plurality of memory cells arranged at the respective intersections of bit lines and word lines. Memory cell array 110 may include a plurality of conventionally defined memory blocks. However, FIG. 1 shows only a single unit memory block as an example for purposes of clarity. Each memory block within memory cell array 110 will include a plurality of memory cell strings. Each string, as illustrated in FIG. 1, may be configured in relation to a string selection transistor SST, a ground selection transistor GST, and M serially-connected memory cells MC0~MCm-1 arranged between the string and ground selection transistors SST and GST.

In each string, the drain of the string selection transistor SST is connected to a corresponding bit line and the source of the ground selection transistor GST is connected to a common source line CSL. The plurality of word lines WL0~WLm-1 are arranged to intersect the collection of memory cell strings. Respective word lines WL0~WLm-1 are coupled to the control gates of memory cells MC0~MCm-1 within in each string. Program data may be written to and/or read data may be read from selected memory cell(s) by applying a defined program/read voltage to a selected word line. In the illustrated embodiment, bit lines BL0~BLn-1 are electrically connected to page buffer 140.

Row decoder 120 further comprises a block selector 121, a string selection signal driver 124, a word-line (WL) selection signal driver 126, and a ground selection signal driver 128.

Block selector 121 operates to select a memory block from a plurality of memory blocks. The selected memory block is driven by modifying a voltage applied to a block selection line BLKWL in correspondence with an input address ADDR. The block selection line BLKWL, as shown in FIG. 1, is connected to gates of block selection transistors BSST, BST0~BSTm-1, and BGST in common (BSST is for block string selection). In one related embodiment, the block selection transistors BSST, BST0~BSTm-1, and BGST are so-called high-voltage transistors, or transistors capable of operating at relatively greater voltage levels. Although only a single one is illustrated in FIG. 1 for clarity, row decoder 120 may include a plurality of block selectors. For example, in another embodiment of the invention, the number of block selectors apparent in row decoder 120 will equal to the number of memory blocks in memory array 110.

In the illustrated embodiment, block selector 120 is configured to turn ON the block selection transistors BSST, BST0~BSTm-1, and BGST in accordance with the address ADDR, and in response to a block-selection enabling signal nEN and block selection signals P, Q, and R generated by decoding the address ADDR. An exemplary block selector 120 will be described in some additional detail with reference to FIG. 2, hereafter.

SSL driver 122 enables execution of an initial precharge operation for a selected memory block corresponding to the address ADDR during a bit-line (BL) setup period. That is, SSL driver 122 is configured to provide the string selection voltage VSSL which is used to turn ON the string selection transistor SST during the BL setup period in response to the block-selection enabling signal nEN and an SSL drive signal SSLVDD.

In other words, SSL driver 122 operates to apply the string selection voltage VSSL to the string selection line SSL before providing the pass voltage to the word lines WL0~WLm-1. Thus, it is permissible for strings which may include program-inhibited cells to execute an initial precharge operation via their corresponding bit lines regardless of whether the WL selection signal lines SI0~SIm-1 are completely charged to the pass voltage. An exemplary SSL driver 122 operating within row decoder 120 will be described in some additional detail with reference to FIGS. 2 and 3 hereafter.

String selection signal driver 124 applies a drive voltage to a string selection signal line SS. WL selection signal driver 126 applies the drive voltage to the WL selection signal lines SI0~SIm-1. Ground selection signal driver 128 applies a drive voltage to a ground selection signal line GS. Although not shown in FIG. 1, a plurality of memory blocks may share the string selection signal line SS, the WL selection signal lines SIi (SI0~SIm-1), and the ground selection signal line GS.

SSL driver 122 within row decoder 120 may directly apply the string selection voltage VSSL to the string selection line SSL. That is, SSL driver 122 may apply the string selection voltage VSSL to the string selection line SSL while the WL signal lines SI0~SIm-1 are being charged to the pass voltage during the BL setup period of a programming operation. The string selection voltage VSSL is a voltage capable of turning ON the string selection transistor SST.

High voltage generator & control logic circuit 130 is configured to generate and provide certain high voltages necessary for driving the internal circuits, in response to control signals CTRL such as nCE, nRE, nWE, CLE, ALE, and nWP. Of course, these are merely exemplary control signals as will be understood by those skilled in the art. Thus, high voltage generator & control logic circuit 130 controls general operation of the internal circuits of nonvolatile memory device 100. In particular, high voltage generator & control logic circuit 130 generates the block-selection enabling signal nEN allowing row decoder 120 to select a memory block in accordance with the address ADDR and generate the SSL drive signal SSLVDD associated with the initial precharge operation.

While FIG. 1 shows the block-selection enabling signal nEN being provide by voltage generator and control logic circuit 130, it may be otherwise provided in other embodiments of the invention. The block-selection enabling signal nEN according to certain embodiments of the invention is activated after a predetermined period of time (hereafter, "a BL setup period") following input of the address ADDR during the programming operation. In certain embodiments of the invention, the block-selection enabling signal nEN may be generated within row decoder 120. An exemplary block-selection enabling signal nEN will be described in some additional detailed with reference to FIG. 3 hereafter.

Further, while FIG. 1 illustrates the SSL drive signal SSLVDD being generated by voltage generator and control logic circuit 130, it may be otherwise provided in certain embodiments of the invention. For example, the SSL drive signal SSLVDD may be generated within row decoder 120. However, embodiments of the invention activate the SSL drive signal SSLVDD to begin execution of the initial precharge operation during the BL setup period.

Page buffer 140 temporarily stores program data to be written into memory cell array 110 during a programming operation, or temporarily stores read data retrieved from memory cell array 110 during a read operation. Page buffer 140 is connected to memory cell array 110 via the plurality of bit lines BL0~BLn-1. As is conventionally understood, page buffer 140 may include a plurality of latches (not shown) corresponding respectively to each bit line. These latches may be used to store program data or read data.

Page buffer 140 supplies a ground voltage GND or a power source voltage VDD to the bit lines in accordance with data values stored in the latches during the programming operation. For instance, a bit line connected to a latch storing a data value of '0' (i.e., a bit line connected to a program cell) is supplied with the ground voltage GND. A bit line connected to a latch storing a data value of '1' (i.e., a bit line connected to a program-inhibited cell) is supplied with the power source voltage VDD.

Nonvolatile memory device 100 according to the illustrated embodiment of the invention is configured to charge the WL signal lines SI0~SIm-1 with the pass voltage while also conducting the initial precharge operation during a programming operation. Thus, the "pass voltage charge operation" and the "initial precharge operation", as defined above, may be said to be simultaneously executed. The term "simultaneously executed" means that these two operations temporally overlap in their execution at least in part. In order to accomplish this simultaneous execution, row decoder 120 is configured to comprise SSL driver 122 adapted to directly provide the string selection voltage VSSL to the string selection line SSL.

By way of comparison, in a conventional nonvolatile memory device, an analogous initial precharge operation is executed using a string selection voltage transferred via a string selection line after selecting a memory block. In contrast, a nonvolatile memory device according to an embodiment of the invention executes the initial precharging operation by applying the string selection voltage to the string selection line SSL before selecting the memory block. Thus, it is permissible for nonvolatile memory device 100 according to an embodiment of the invention to execute the pass voltage charge operation (i.e., charge the WL signal lines SI0~SIm-1 with the pass voltage) while simultaneously executing the initial precharging operation before selecting the memory block. As a result, a pass voltage activation time measured from completion of the pass voltage charge operation may be advanced over that provided by conventional nonvolatile memory devices. Additionally, since the pass voltage activation time is advanced, the necessary charging margin provided by a constituent charge pump may be reduced, thereby allowing reduction in the size of the charge pump.

Figure 2:
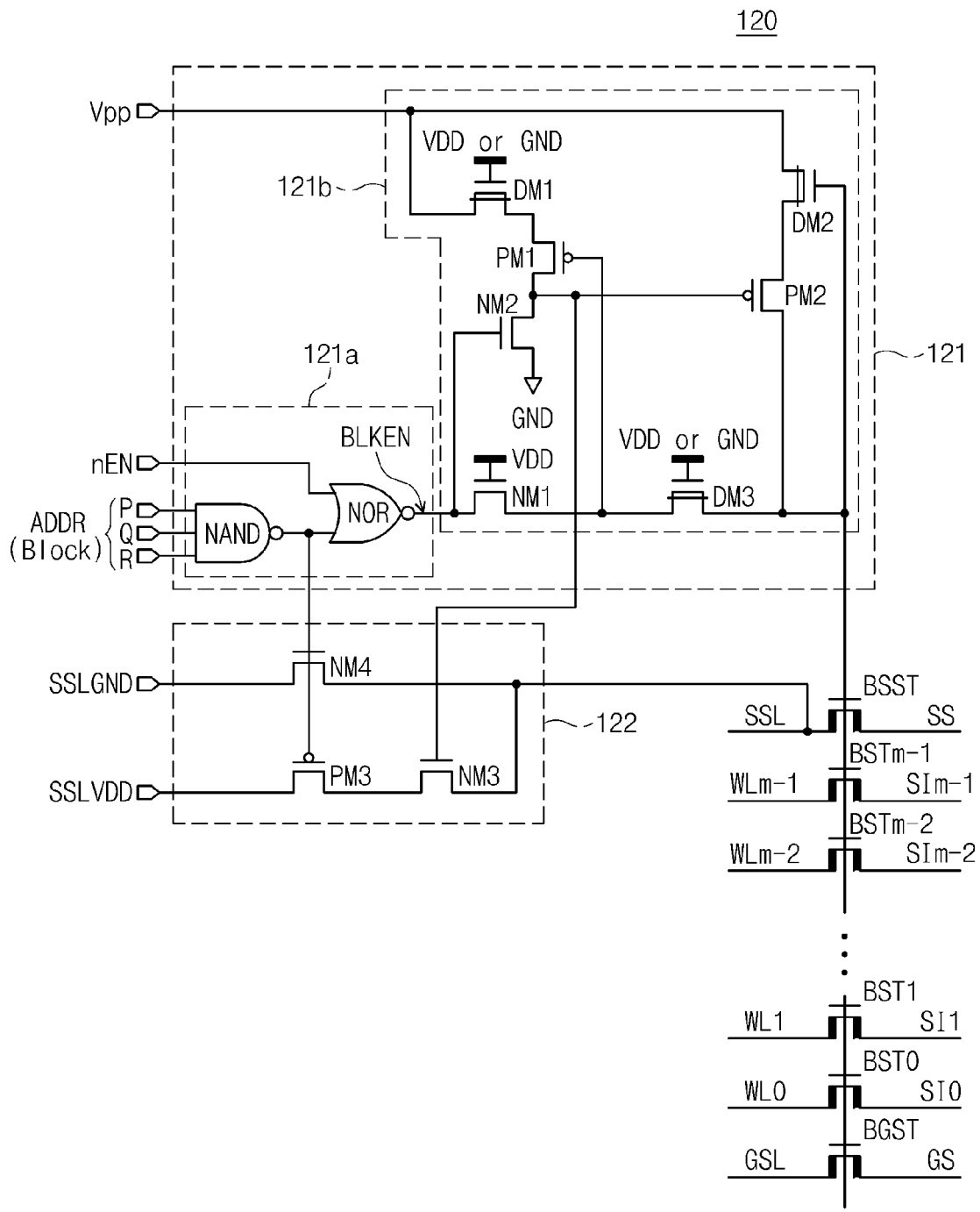
FIG. 2 is a circuit diagram further illustrating the row decoder shown in FIG. 1.

FIG. 2 is a circuit diagram further illustrating row decoder 120 of FIG. 1. Referring to FIG. 2, row decoder 120 comprises block selector 121 and SSL driver 122. SSL driver 122 is configured to provide the string selection voltage VSSL to the string selection line SSL during the pass voltage charge operation (i.e., while the WL signal lines SI0~SIm-1 are being charged to the pass voltage Vpass) in the programming operation. In the illustrated embodiment, operation of SSL driver 122 is controlled in response to signals P, Q, and R decoded from the address ADDR.

Block selector 121 includes a block-enable signal generator 121a and a block-selection WL driver 121b. Block-enable signal generator 121a operates in response to the block-selection enabling signal nEN and the signals P, Q, and R decode from the address ADDR which are relevant to block selection, thereby generating a block-enable signal BLKEN. In the illustrated embodiment, block-enable signal generator 121a comprises both NAND and NOR gates. The NAND gate receives the decoded address signals P, Q, and R defining a memory block selection and provides a NANDed output. The NOR gate receives the NANDed output and the block-selection enabling signal nEN and provides a NORed output. The NORed output functions as the block-enable signal BLKEN.

Block-selection WL driver 121b supplies a high voltage Vpp to the block selection line BLKWL in response to the block-enable signal BLKEN. Block-selection WL driver 121b includes first, second, and third depletion transistors DM1, DM2, and DM3, first and second PMOS transistors PM1 and PM2, and first and second NMOS transistors NM1 and NM2.

The first NMOS transistor NM1 has a drain connected to the output of the NOR gate and a gate coupled to the power source voltage VDD. The first depletion transistor DM1, as an NMOS depletion transistor, has a drain connected to the high voltage Vpp. The first PMOS transistor PM1 has a source connected to a source of the first depletion transistor DM1 and a gate connected to a source of the first NMOS transistor NM1. The second NMOS transistor NM2 has a drain connected to a drain of the first PMOS transistor PM1, a source connected to the ground voltage GND, and a gate coupled to the output of the NOR gate.

The second depletion transistor DM2, as an NMOS depletion transistor, has a drain connected to the high voltage Vpp and a gate coupled to the block selection line BLKWL. The second PMOS transistor PM2 has a source connected to a source of the second depletion transistor DM2, a drain connected to the block selection line BLKWL, and a gate coupled to the drain of the first PMOS transistor PM1. The third depletion transistor DM3, as an NMOS depletion transistor, has a drain connected to the source of the first NMOS transistor NM1 and a source connected to the block selection line BLKWL. The gates of the first and third depletion transistors DM1 and DM3 are coupled to the power source voltage VDD or the ground voltage GND.

Block selector 121 regulates a voltage of the block selection line BLKWL in response to the decode address block selection signals P, Q, and R and the block-selection enabling signal nEN. The block selection line BLKWL is commonly connected to gates of the block selection transistors BSST, BST0~BSTm-1, and BGST. Thus, block selector 121 electrically connects the selection lines SSL and GSL and the word lines WL0~WLm-1 of its corresponding memory block to the block-selection signal lines SS and GS and the WL signal lines SI0~SIm-1, respectively.

SSL driver 122 provides the string selection line SSL with the ground voltage GND or the string selection voltage VSSL. The string selection voltage VSSL has a voltage level sufficient to turn ON the string selection transistor SST during the programming operation.

SSL driver 122 includes a third PMOS transistor PM3, a third NMOS transistor NM3, and a fourth NMOS transistor NM4. The third PMOS transistor PM3 has a source receiving the SSL drive signal SSLVDD and a gate coupled to the output of the NAND gate of the block selector 121. The third NMOS transistor NM3 has a drain connected to a drain of the third PMOS transistor PM3, a source connected to the string selection line SSL, and a gate coupled to the drain of the second NMOS transistor NM2 of the block selector 121. The fourth NMOS transistor NM4 has a drain receiving an SSL ground signal SSLGND, a source connected to the string selection line SSL, and a gate coupled to the output of the NAND gate of the block selector 121.

Figure 3:
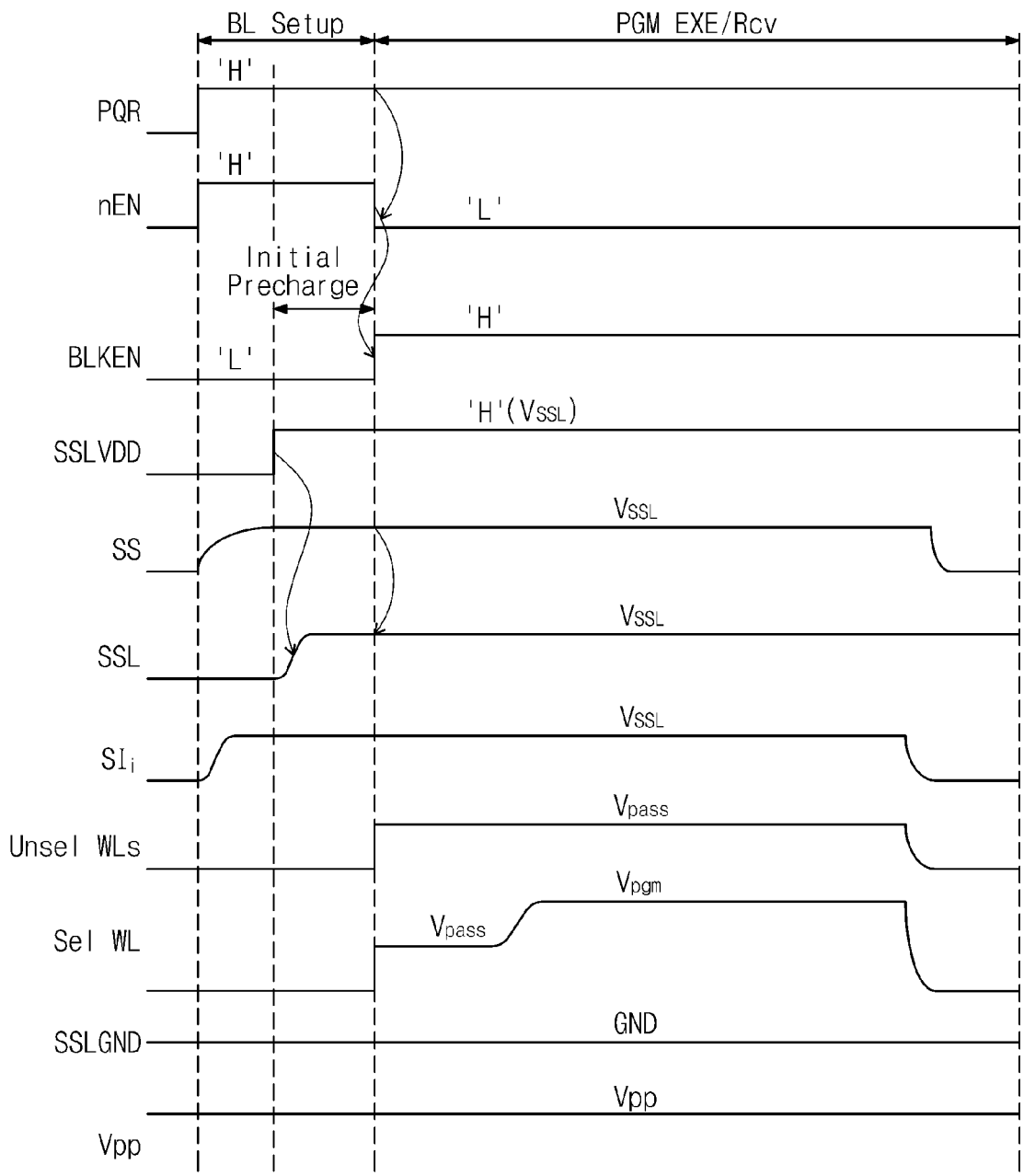
FIG. 3 is a timing diagram for a programming operation capable of being executed using the row decoder shown in FIG. 2.

FIG. 3 is a timing diagram for a programming operation capable of being executed by row decoder 120 of in FIG. 2. In nonvolatile memory device 100 according to an embodiment of the invention, the WL signal lines SIi are precharged to the pass voltage Vpass during the BL setup period. During the BL setup period, the ground voltage (e.g., 0V) is applied to bit lines connected to program cells (i.e., cells to be programmed) while the power source voltage VDD is applied to bit lines connected to program-inhibited cells. In this manner, the pass voltage activation time is able to be advanced during the programming operation and corresponding recovery period. Referring to FIGS. 2 and 3, an exemplary programming operation may be executed as follows.

During the programming operation, the block selection signals P, Q, and R decode from the address ADDR are maintained at a logically "high" level. The block-selection enabling signal nEN is held high during the BL setup period, and held "low" during the programming operation and its corresponding recovery period. As illustrated in FIG. 3, the programming operation is executed by dividing the overall procedure into a BL setup period and the programming execution/recovery (PGM EXE/Rcv) period.

During the BL setup period, the plurality of bit lines BL0~BLn-1 are charged to the power source voltage VDD or the ground voltage GND in accordance with data stored in the page buffer latches. For instance, a bit line connected to a program cell receives the ground voltage GND while another bit line connected to a program-inhibited cell receives (is charged to) the power source voltage VDD. During the BL setup period, the initial precharge operation is executed for strings including program-inhibited cells by precharging the WL signal lines SIi (i.e., SI0~SIm-1) to the pass voltage.

During the PGM EXE/Rcv period, a programming loop implementing the programming operation is executed as is conventionally understood by those skilled in the art. For example, a program voltage Vpgm may be applied to a selected word line while the pass voltage Vpass is applied to unselected word lines. After completing a programming loop, a recovery process begins. The recovery process may include grounding (or discharging) the word lines WL0~WLm-1 and the bit lines BL0~BLn-1.

After the recovery process is completed, a conventional verify-read operation may be executed. Through the verify-read operation, data values are read from memory cells connected to the selected word line via page buffer 140. The read data is stored in the page buffer latches. Thereafter, high voltage generator & control logic circuit 130 electrically isolates the latches from the bit lines BL0~BLn-1. After the verify-read operation, a conventional pass/fail checking process may be executed.

Operation of row decoder 120 during the BL setup and PGM EXE/Rcv periods will now be described in some additional detail. A block selection operation is executed in relation to the block selection signals P, Q, and R and the block-selection enabling signal nEN. A sequence of the block-enable signal BLKEN shows such a procedure for block selection.

First, row decoder 120 operates as follows the BL setup period. Since a current block is to be programmed, the block selection signals P, Q, and R are all set to high and the NAND gate outputs a low. Meantime, the block-selection enabling signal nEN is low because it is inactive during the BL setup period. The NOR gate outputs a low from the low NANDed output and the high block-selection enabling signal nEN. Thus, a low block-enable signal BLKEN is generated.

In response to the low output of the NOR gate, the second NMOS transistor NM2 is turned OFF. As the low output of the NOR gate is transferred to the source of the first NMOS transistor NM1, the first PMOS transistor PM1 is turned ON. During this, since the first depletion transistor DM1 is conductive by channel, the high voltage Vpp is transferred to the drain of the first PMOS transistor PM1. Then, the second PMOS transistor PM2 is turned ON. And, as the third depletion transistor DM3 is conductive by channel, the low-level state at the source of the first NMOS transistor NM1 is transferred to the block selection line BLKWL. Then, the block selection line BLKWL becomes low. As a result, the block selection transistors BSST, BST0~BSTm-1, and BGST are all turned OFF.

In response to the low output of the NAND gate, the fourth NMOS transistor NM4 of the SSL driver 122 is turned OFF and the third PMOS transistor PM3 is turned ON. As the drain of the first PMOS transistor PM1 is high, the third NMOS transistor NM3 of the SSL driver 122 is turned ON. Hence, the SSL drive signal SSLVDD is applied to the string selection line SSL connected to the source of the third NMOS transistor NM3. Here, the SSL drive signal SSLVDD maintains a high level for the string selection voltage VSSL from the beginning of the initial precharge operation during the BL setup period. Therefore, SSL driver 122 will apply the string selection voltage VSSL to the string selection line SSL in response to the SSL drive signal SSLVDD. And, in response to the string selection voltage VSSL applied to the string selection line SSL, the string selection transistor SST is turned ON. Then, the initial precharge operation is executed for strings including program-inhibited cells.

As shown in FIG. 3, the SSL drive signal SSLVDD maintains a high since the beginning of the initial precharge operation during the BL setup period. But, the SSL drive signal SSLVDD need not always be configured thus. The SSL drive signal SSLVDD may be high only for the period during which the initial precharge operation is executed.

In the meantime, while executing the initial precharge operation in relation to the strings including program-inhibited cells, the string selection signal line SS is charged to the string selection voltage VSSL and the WL signal lines SIi are charged to the pass voltage Vpass. In a conventional nonvolatile memory device, the pass voltage is applied to the WL signal lines in the PGM EXE/Rcv period after the initial precharge operation. Otherwise, in nonvolatile memory device 100 according to an embodiment of the invention, the pass voltage Vpass is applied to the WL signal lines SIi before the PGM EXE/Rcv period, i.e., during the BL setup period.

Next, row decoder 120 operates as follows during the PGM EXE/Rcv period. The block-selection enabling signal nEN is low because it is activated in the PGM EXE/Rcv period. During this time period, the block selection signal P, Q, and R are maintaining high. The NAND gate outputs a low and the NOR gate outputs a high in response to the low output of the NAND gate and the low block-selection enabling signal nEN. In response to the high output of the NOR gate, the second NMOS transistor NM2 is turned ON. Then, the drain of the second NMOS transistor NM2 is grounded, such that the second PMOS transistor PM2 is turned ON.

Through a feedback action between the second depletion transistor DM2 and the second PMOS transistor PM2, a voltage of the block selection line BLKWL slightly rises from the high voltage Vpp by a threshold voltage of the second depletion transistor DM2. According to a voltage increase of the block selection line BLKWL, the block selection transistors BSST, BST0~BSTm-1, and BGST are turned ON. Then, the string selection line SSL is electrically connected to the string selection signal line SS, the word liens WL0~WLm-1 are electrically connected to the WL signal lines SI0~SIm-1 respectively, and the ground selection line GSL is electrically connected to the ground selection signal line GS. Thereby, the pass voltage Vpass is supplied to the selected and unselected word lines (Sel WL and Unsel WLs). Afterward, the program voltage Vpgm is applied to the selected word line.

Responding to the low output of the NAND gate, the fourth NMOS transistor NM4 of the SSL driver 122 is turned OFF and the third PMOS transistor PM3 is turned ON. As the drain of the first PMOS transistor PM1 is low, the third NMOS transistor NM3 of the SSL driver 122 is turned OFF. Thus, the string selection line SSL is interrupted to the string selection voltage VSSL provided from SSL driver 122. Instead, the string selection line SSL is supplied with the string selection voltage VSSL from the string selection signal line SS by way of the block selection transistor BSST.

The aforementioned description relates to a case wherein row decoder 120 operates to select a memory block in response to an input address ADDR. On the other hand, row decoder 120 may operate as follows when deselecting a memory block in response to an input address ADDR. In such a case, a low state is established by block selection signals P, Q, and R decoded from the address ADDR for block selection. Accordingly, the NAND gate outputs a high and the NOR gate outputs a low that is transferred to the source of the first NMOS transistor NM1. Sequentially, the low output of the NOR gate is transferred to the block selection line BLKWL through the third depletion transistor DM3. Thus, the block selection transistors BSST, BST0~BSTm-1, and BGST are all turned OFF.

Further, the high output of the NAND gate turns OFF the fourth NMOS and third PMOS transistors NM4 and PM3 of SSL driver 122. Hence, the SSL ground signal SSLGND is supplied to the string selection line SSL. Here, the SSL ground line SSLGND is the ground voltage GND as shown in FIG. 3.

In nonvolatile memory device 100, the WL signal lines SI0~SIm-1 are preliminarily precharged to the pass voltage Vpass during the BL setup period of the programming operation. In other words, the WL signal lines SI0~SIm-1 are charged to the pass voltage Vpass while simultaneously executing the initial precharge operation. This arrangement advances the pass voltage activation time during the PGM EXE/Rcv period. Since it is able to earlier charge the WL signal lines SI0~SIm-1 before the PGM EXE/Rcv period, the size of the constituent charge pump (commonly provided within a high voltage generator) may be smaller than is conventionally required. This is because the preliminary charge of pass voltage during the BL setup period of the programming operation reduces the time during which the charge pump must generate a large amount of charge in the PGM EXE/Rcv period. Therefore, a nonvolatile memory device according to an embodiment of the invention is advantageous in advancing the pass voltage activation time and thereby reducing the charge pumping burden placed on the charge pump during the programming operation.

Figure 4:
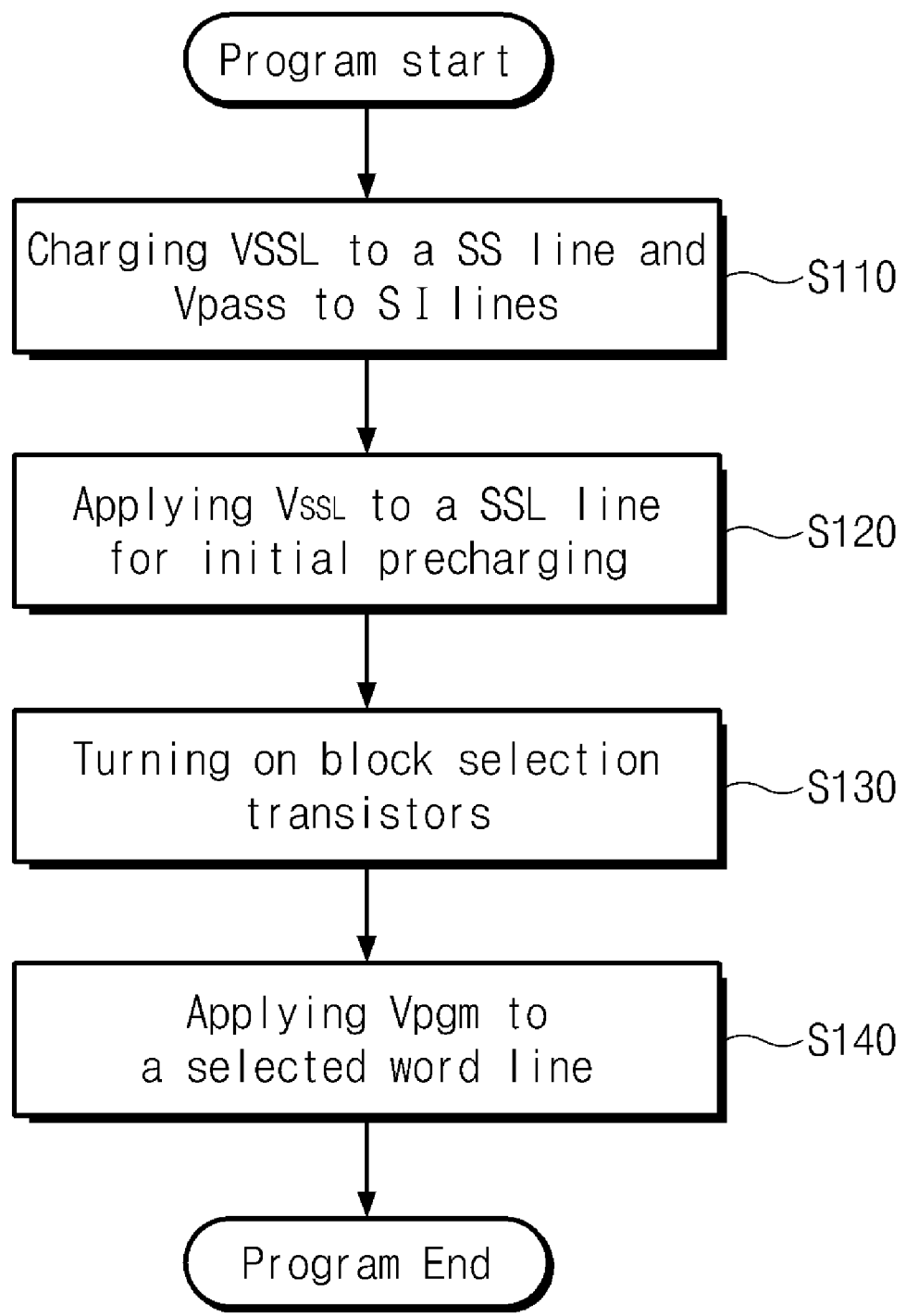
FIG. 4 is a flow chart summarizing a programming method for a nonvolatile memory device according to an embodiment of the invention.

FIG. 4 is a flow chart summarizing an exemplary programming method for a nonvolatile memory device according to certain embodiments of the invention. Referring to FIGS. 1 through 4, a programming method for a nonvolatile memory device according to an embodiment of the invention will be described in some additional detail. During the programming operation, high voltage generator & control logic circuit 130 charges the string selection signal line SS to the string selection voltage VSSL during the BL setup period, and charges the string selection signal line SS to the pass voltage Vpass (S110). Meanwhile, SSL driver 122 in row decoder 120 applies the string selection voltage VSSL to the string selection line SSL in order to execute the initial precharge operation for the strings including program-inhibited cells in the memory block selected by the input address ADDR (S120).

Afterward, row decoder 120 turns ON the block selection transistors BSST, BST0~BSTm-1, and BGST in response to the block-selection enabling signal nEN provided by high voltage generator & control logic circuit 130 (S130). And, high voltage generator & control logic circuit 130 applies the program voltage Vpgm to the word line (i.e., Sel WL) selected by the address ADDR. Thereby, the programming operation within the nonvolatile memory device is terminated.

According to the foregoing programming method, after charging the WL signal lines to the pass voltage and executing the initial precharge operation during the BL setup period, the block selection transistors are turned ON during the PGM EXE/Rcv period. This advances the pass voltage activation time.

SSL driver 122 shown in FIG. 1 provided within row decoder 120. However, SSL driver 122 may be otherwise provided, so long as it is able to apply the string selection voltage VSSL to the string selection line SSL without requiring use of the string selection signal line SS.

Figure 5:
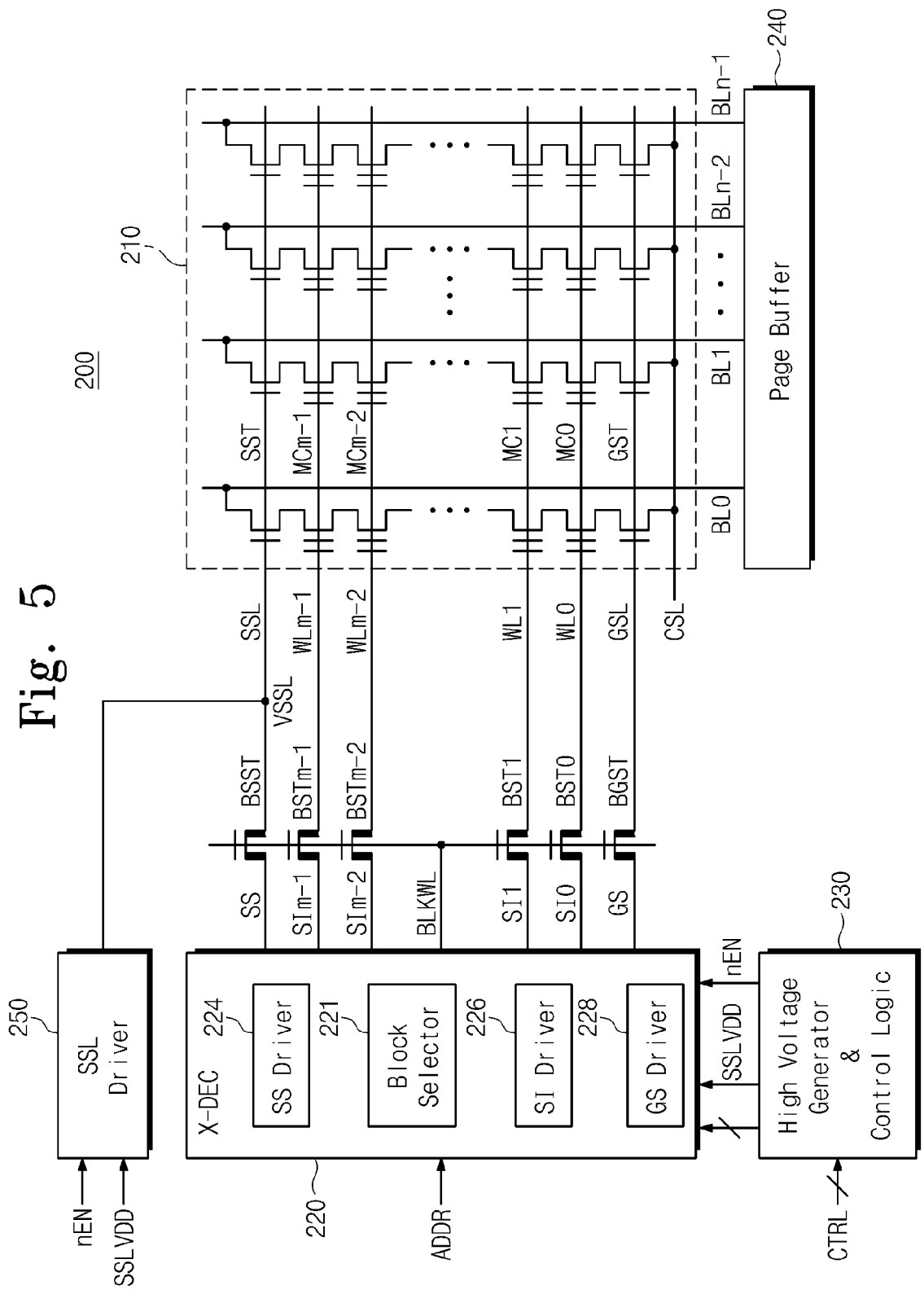
FIG. 5 is a circuit diagram of a nonvolatile memory device according to another embodiment of the invention.

In this regard, FIG. 5 is a circuit diagram of a nonvolatile memory device 200 according to another embodiment of the invention. Referring to FIG. 5, a SSL driver 250 is provided external to row decoder 220. SSL driver 250 is configured to apply the string selection voltage VSSL into the string selection line SSL in response to the block-selection enabling signal nEN. Other functional circuits are configured as same as those shown in FIG. 1.

Figure 6:
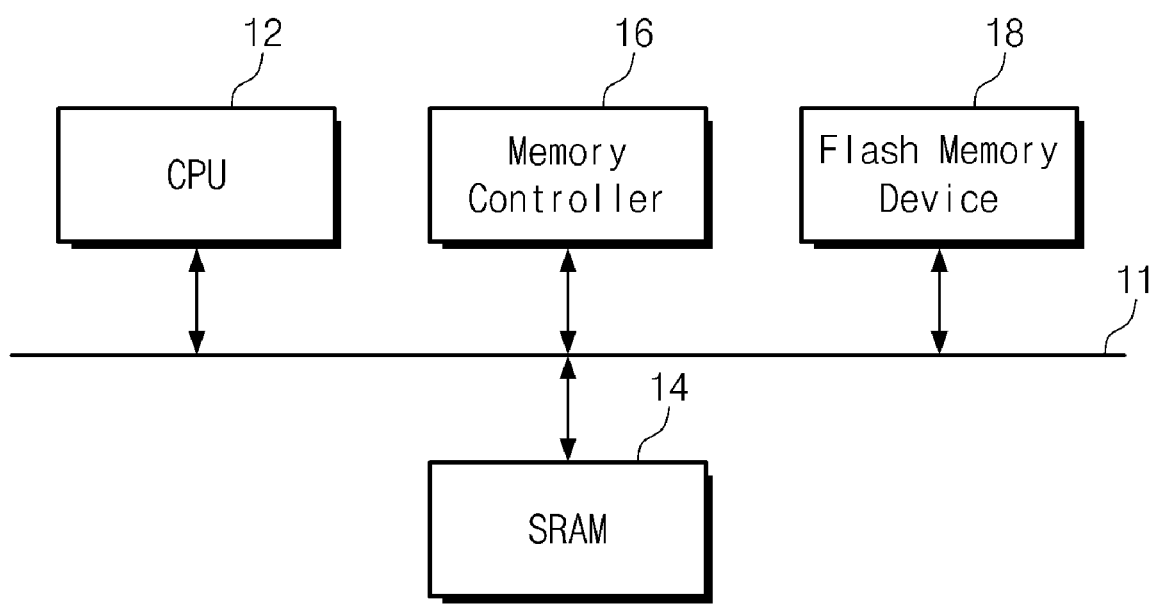
FIG. 6 is a general block diagram of a system incorporating a nonvolatile memory device according to an embodiment of the invention.

FIG. 6 is a general block diagram of a system incorporating a nonvolatile memory device according to an embodiment of the present invention. Referring to FIG. 6, system 10 comprises of a central processing unit (CPU) 12, a SRAM 14, a memory controller 16, and a flash memory device 18, all of which are connected through a bus 11. Flash memory device 18 may be configured in a manner consistent with the illustrated embodiments of FIG. 1 through 5. Flash memory 18 may include memory cells adapted to store N-bit data, where N is a positive integer greater than 1.

Although not shown in FIG. 6, it can be seen by those skilled in the art that system 10 according to an embodiment of the invention may further comprise of an application chipset, a camera image processor (CIS), a mobile DRAM, and so forth. Memory controller 16 and flash memory device 18 may constitute a solid state disk (SSD) using a nonvolatile memory for storing data.

Flash memory device 18 and/or memory controller 16 may be mounted on system 10 using various types of packages. For instance, flash memory device 18 and/or memory controller 16 may be placed thereon by any package type, e.g., Package-on-Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip-On-Board (COB), CERamic Dual In-line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), Thin Quad Flat Pack (TQFP), System In Package (SIP), Multi-Chip Package (MCP), Wafer-level Fabricated Package (WFP), Wafer-level Processed Stack Package (WSP), or Wafer-level Processed Package (WSP).

The above-disclosed subject matter is to be considered illustrative, and not restrictive, and the appended claims are intended to cover modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A programming method for a nonvolatile memory device, comprising:
    charging word-line signal lines to a pass voltage during a pass voltage charge operation;
    simultaneously executing an initial precharge operation for strings including program-inhibited cells during the pass voltage charge operation; and applying the pass voltage to word lines from the word-line signal lines in response to a block-selection enabling signal.

2. The method of claim 1, wherein charging the pass voltage charge operation is executed during a bit-line setup period.

3. The method of claim 1, wherein executing the initial precharge operation comprises applying a string selection voltage to a string selection line to turn ON a string selection transistor.

4. The method of claim 3, wherein during the initial precharging operation, the string selection voltage is applied to the string selection line without using a block-selection signal line.

5. The method of claim 4, wherein during the initial precharge operation, the string selection voltage is supplied from a string selection line driver within a row decoder.

6. The method of claim 4, wherein the string selection voltage is applied to the string selection line without using the block-selection signal line during the bit-line setup period, but is applied to the string selection line using the block-selection signal line during a programming execution/recovery period.

7. The method of claim 1, wherein the block-selection enabling signal is activated during a programming execution/recovery period,
wherein a program voltage is applied to a selected word line during the programming execution/recovery period.

8. The method of claim 1, wherein the word-line signal lines are charged to the pass voltage at a beginning of a bit-line setup period.

9. The method of claim 1, wherein the block-selection enabling signal is inactivated during a bit-line setup period,
wherein the initial precharge operation is executed during the bit-line setup period.

10. The method of claim 9, wherein a string selection voltage is applied to a string selection signal line during the bit-line setup period.

11. A nonvolatile memory device comprising:
a block string selection transistor electrically connecting a string selection signal line to a string selection line in response to a block-enable signal;
block selection transistors electrically connecting word-line signal lines to word lines respectively in response to the block-enable signal; and
a string selection line driver applying a string selection voltage to the string selection line to execute an initial precharge operation for strings including program-inhibited cells while simultaneously charging the word-line signal lines to a pass voltage while the block-enable signal is inactive during a programming operation.

12. The nonvolatile memory device of claim 11, wherein the block string selection transistor and the block selection transistors share a block selection line for receiving the block-enable signal.

13. The nonvolatile memory device of claim 11, wherein the string selection signal line is charged to a string voltage while the block-enable signal is inactive during the programming operation.

14. The nonvolatile memory device of claim 12, wherein the string selection line driver applies the string selection voltage to the string selection line while the block-enable signal is inactive during the programming operation.

15. The nonvolatile memory device of claim 12, wherein the string selection line driver interrupts the string selection voltage to the string selection line while the block-enable signal is active during the programming operation.

16. The nonvolatile memory device of claim 12, wherein the string selection line driver selects a block in accordance with an input address applied to a row decoder selecting a word line to be driven.

17. The nonvolatile memory device of claim 16, wherein the row decoder comprises:
a block selector configured to select a memory block in response to a block-selection enabling signal and signals decoded from the input address for block selection when the block-selection enabling signal is active.

18. The nonvolatile memory device of claim 17, wherein the block selector comprises:
a block-enable signal generator generating the block-enable signal in response to the block-selection enabling signal and the signals decoded from the input address for block selection; and
a block-selection word-line driver applying a high voltage to a block-selection word line in response to the block-enable signal of the block-enable signal generator so as to turn the block sting transistor and the block selection transistors,
wherein the block-selection enabling signal is activated after a bit-line setup period.

19. The nonvolatile memory device of claim 18, wherein the block-enable signal generator comprises:
a NAND gate receiving the signals decoded from the input address for block selection; and
a NOR gate receiving the block-enable signal in response to an output of the NAND gate and the block-selection enabling signal.

20. The nonvolatile memory device of claim 19, wherein the string selection line driver comprises:
a PMOS transistor having a source receiving a string selection line drive signal and a gate receiving the output of the NAND gate;
a first NMOS transistor having a drain connected to a drain of the PMOS transistor, a source connected to the string selection line, and a gate receiving the block-selection enabling signal; and
a second NMOS transistor having a drain receiving a string selection line ground signal, a source connected to the string selection line, and a gate receiving the output of the NAND gate.

* * * * *